(12) United States Patent
Jeong et al.

(10) Patent No.: US 8,630,123 B2
(45) Date of Patent: Jan. 14, 2014

(54) METHOD OF OPERATING NONVOLATILE MEMORY DEVICE

(71) Applicant: SK hynix Inc., Gyeonggi-do (KR)

(72) Inventors: Byoung Kwan Jeong, Jeollabuk-do (KR); Chul Woo Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/750,614

(22) Filed: Jan. 25, 2013

(65) Prior Publication Data
US 2013/0141998 A1 Jun. 6, 2013

Related U.S. Application Data

(62) Division of application No. 12/618,973, filed on Nov. 16, 2009, now Pat. No. 8,374,036.

(30) Foreign Application Priority Data

Nov. 14, 2008 (KR) .................. 10-2008-0113425
Jun. 29, 2009 (KR) .................. 10-2009-0058495

(51) Int. Cl.
*G11C 16/04* (2006.01)

(52) U.S. Cl.
USPC .................. 365/185.19; 365/185.29

(58) Field of Classification Search
USPC .................. 365/185.19, 185.29, 185.18
See application file for complete search history.

(56) References Cited

U.S. PATENT DOCUMENTS

2008/0266970 A1* 10/2008 Lee et al. ............ 365/185.19

* cited by examiner

*Primary Examiner* — Huan Hoang
(74) *Attorney, Agent, or Firm* — IP & T Group LLP (57) ABSTRACT

A method of operating a nonvolatile memory device comprises reading erase number information which is updated and stored whenever erasure is performed, setting program start voltages and step voltages based on the erase number information, and performing a program operation based on the program start voltages and the step voltages.

6 Claims, 6 Drawing Sheets

METHOD OF OPERATING NONVOLATILE MEMORY DEVICE

CROSS-REFERENCE TO RELATED APPLICATION

This application is a division of U.S. patent application Ser. No. 12/618,973 filed on Nov. 16, 2009, which claims priority of Korean Patent Application No. 10-2008-0113425 filed on Nov. 14, 2008 and Korean Patent Application No. 10-2009-0058495 filed on Jun. 29, 2009. The disclosure of each of the foregoing applications is incorporated herein by reference in their entireties.

BACKGROUND

Embodiments relate to a method of operating a nonvolatile memory device.

In recent years, there has been an increasing demand for nonvolatile memory devices which can be electrically programmed and erased and which do not require the refresh function of rewriting data at specific intervals.

The nonvolatile memory device is configured to enable electrical program and erase operations and perform the program and erase operations through threshold voltages which vary when electrons are moved by a strong electric field applied to a thin oxide layer.

The nonvolatile memory device mainly includes a memory cell array in which cells for storing data are arranged in a matrix form and a page buffer for writing data into specific cells of the memory cell array or reading data stored in specific cells thereof. The page buffer includes a bit line pair coupled to a specific memory cell, a register for temporarily storing data to be written into the memory cell array or for reading data stored in a specific memory cell of the memory cell array and temporarily storing the read data, a sense node for sensing the voltage level of a specific bit line or a specific register, and a bit line selection unit for controlling whether or not to couple the specific bit line to the sensing node.

It is known that the program speed of such a nonvolatile memory device becomes fast with an increase in the number of program/erase cycles. This is because, with the number of program/erase cycles increasing, the amount of electric charges trapped at the floating gate of each memory cell increases, and so the threshold voltage of the memory cell rises. Thus, although a relatively small number of program pulses according to the incremental step pulse program (ISPP) method are applied, the memory cell is programmed to have a threshold voltage higher than a target voltage.

In view of the characteristic, in the ISPP method, a method of applying a low program start voltage may be taken into consideration. If this method is used when the number of program/erase cycles is small, however, there is a concern in that the program time increases. This is because the number of pulses that have to be applied according to a lowering in the program start voltage is increased.

BRIEF SUMMARY

Embodiments relate to a method of operating a nonvolatile memory device, which is capable of increasing the program speed and improving the integrity of data by changing an operating voltage according to the number of program/erase cycles.

A program method of a nonvolatile memory device includes reading erase number information which is updated and stored whenever erasure is performed, setting program start voltages and step voltages based on the erase number information, and performing a program operation based on the program start voltages and the step voltages.

The setting of the program start voltages and the step voltages based on the erase number information includes decreasing the program start voltages and the step voltages with an increase in a number of erase operations corresponding to the erase number information and, where the erase number information consists of a total of n bits, setting a $2^n$ number of program start voltages and a $2^n$ number of step voltages as the program start voltages and the step voltages, respectively.

The setting of the program start voltages and the step voltages based on the erase number information includes decreasing the program start voltages and the step voltages with an increase in a number of erase operations corresponding to the erase number information, and whenever the erase number information is changed, decreasing each of the program start voltages by approximately 0.1V to approximately 1.0V.

The setting of the program start voltages and the step voltages based on the erase number information includes decreasing the program start voltages and the step voltages with an increase in a number of erase operations corresponding to the erase number information, and whenever the erase number information is changed, decreasing each of the step voltages by approximately 0.1V to approximately 1.0V.

An erase method of a nonvolatile memory device includes reading erase number information which is updated and stored in a spare cell whenever erasure is performed, setting an erase voltage based on the erase number information, performing an erase operation based on the erase voltage, after the erase operation is completed, increasing the number of erase operations, and after increasing the number of erase operations, updating the erase number information based on the number of erase operations.

The setting of the erase voltages based on the erase number information includes, whenever the erase number information is changed, increasing the erase voltage by 0.1V to 1.0V.

The updating of the erase number information based on the number of erase operations includes, maintaining the erase number information, where the number of erase operations before being increased is included in an $n^{th}$ erase number section and the number of erase operations after being increased is included in the $n^{th}$ erase number section, and changing the erase number information, where the number of erase operations before being increased is included in an $n^{th}$ erase number section and the number of erase operations after being increased is included in an $(n+1)^{th}$ erase number section.

The erase method further includes programming the erase number information into the spare cell after the updating of the erase number information.

The erase method further includes, after the erase operation is completed, performing a post program operation, repeatedly applying a post program pulse until the post program operation is completed, and counting a number of applied post program pulses.

When the erase operation is performed, the erase voltage is changed according to an increment step pulse erase (ISPE) method.

A read method of a nonvolatile memory device includes reading erase number information which is updated and stored whenever erasure is performed, setting a read voltage based on the erase number information, and performing a read operation based on the read voltage.

The read voltage is increased with an increase in a number of erase operations.

DESCRIPTION OF EMBODIMENTS

Hereinafter, some embodiments of the present disclosure will be described in detail with reference to the accompanying drawings. The drawing figures are provided to allow those having ordinary skill in the art to understand the scope of the embodiments of the disclosure.

Figure 1:
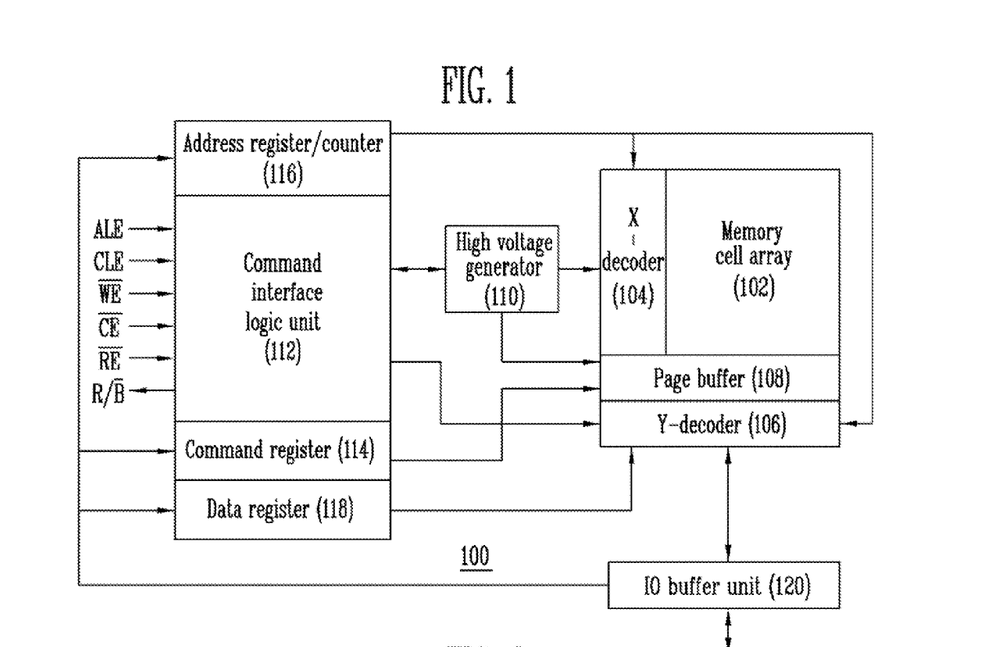
FIG. 1 is a diagram showing the entire construction of a known nonvolatile memory device.

FIG. 1 is a diagram showing the entire construction of a known nonvolatile memory device.

The nonvolatile memory device 100 includes a memory cell array 102, a page buffer 108, an X-decoder 104, a γ-decoder 106, a high voltage generator 110, a command interface logic unit 112, a command register 114, an address register/counter 116, a data register 118, and an IO buffer unit 120. The operation of the nonvolatile memory device is described below.

First, when a chip enable signal $\overline{CE}$ for the command interface logic unit 112 is disabled and a write enable signal $\overline{WE}$ for the command interface logic unit 112 is toggled, the command interface logic unit 112 receives a command signal via the IO buffer unit 120 and the command register 114 in response thereto and generates a program command, an erase command, or a read command in response to the command signal. The command signal includes a page program setup code to determine an operation mode of the nonvolatile memory device. Meanwhile, an operation state signal $R/\overline{B}$ output from the command interface logic unit 112 is disabled for a certain period of time. An external memory controller (not shown) receives the operation state signal $R/\overline{B}$ and recognizes that the nonvolatile memory device is in an operation state, such as a program operation state, an erase operation state, or a read operation state. That is, while the operation state signal $R/\overline{B}$ is disabled, a program operation, an erase operation, or a read operation for one of the pages of the memory cell array is performed.

Furthermore, the address register/counter 116 receives an address signal via the IO buffer unit 120 and generates a row address signal and a column address signal. The address signal corresponds to one of the pages included in the memory cell. The data register 118 temporarily stores various data received via the IO buffer unit 120 and transfers it to the Y-decoder 106.

The high voltage generator 110 generates bias voltages in response to the program command, the erase command, or the read command, and supplies them to the page buffer 108 and the X-decoder 104. In the present disclosure, after a program operation is performed, different pass voltages which are applied on a word line basis during a verification operation are applied according to the locations of the words lines. A detailed method of controlling the pass voltages is described later.

The X-decoder 104 supplies the bias voltages, received from the high voltage generator 110, to one of the blocks of the memory cell array 102 in response to the row address signal. The Y-decoder 106 supplies a data signal to bit lines (not shown) which are shared by the blocks of the memory cell array via the page buffer 108 in response to the column address signal.

The page buffer 108 latches the data signal received via the IO buffer unit 120 and the V-decoder 106 and outputs the latched signal to bit lines (not shown), which are shared by the blocks of the memory cell array.

Figure 2:
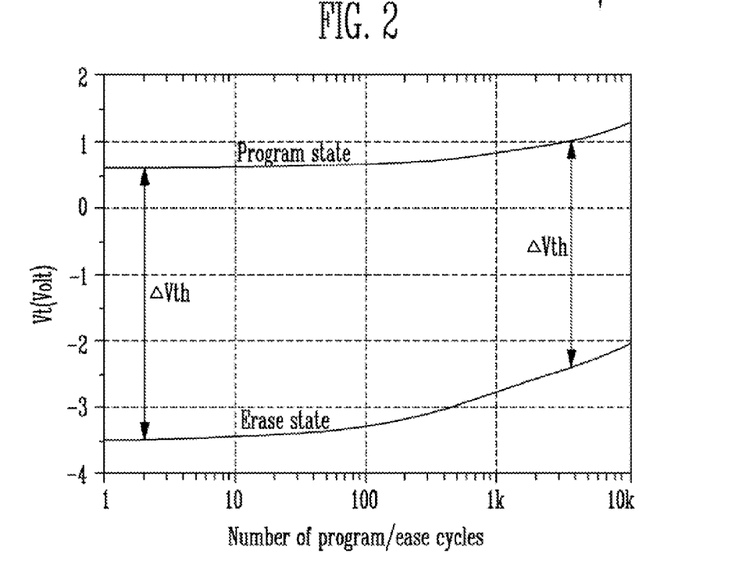
FIG. 2 is a graph showing a shift in the threshold voltage according to an increase in the number of program erase cycles of the known nonvolatile memory device.

FIG. 2 is a graph showing a shift in the threshold voltage according to an increase in the number of program/erase cycles of the known nonvolatile memory device.

As shown in FIG. 2, with an increase in the number of program/erase cycles, the threshold voltages in a program state and an erase state increase. This is because, with the number of program/erase cycles increasing, the amount of electric charges trapped at the floating gate of a nonvolatile memory cell is increased, and so the threshold voltage even in the erase state is increased. Consequently, the amount of a shift in the threshold voltage increases with an increase in the application of the same program pulse. The amount of a shift in the threshold voltage is defined as a program speed. That is, when the same program pulse is applied, if the amount of a shift in the threshold voltage is great, it is considered that the program speed is high.

From FIG. 2, it can be seen that the threshold voltage of the program state is higher when the number of program/erase cycles is 10K times than when the number of program/erase cycles is 10 times. This is true of the erase state, as well. Since the program speed changes according to the number of program/erase cycles as described above, a program method for compensating for the amount of a change in the number of program/erase cycles is desired.

Figure 3:
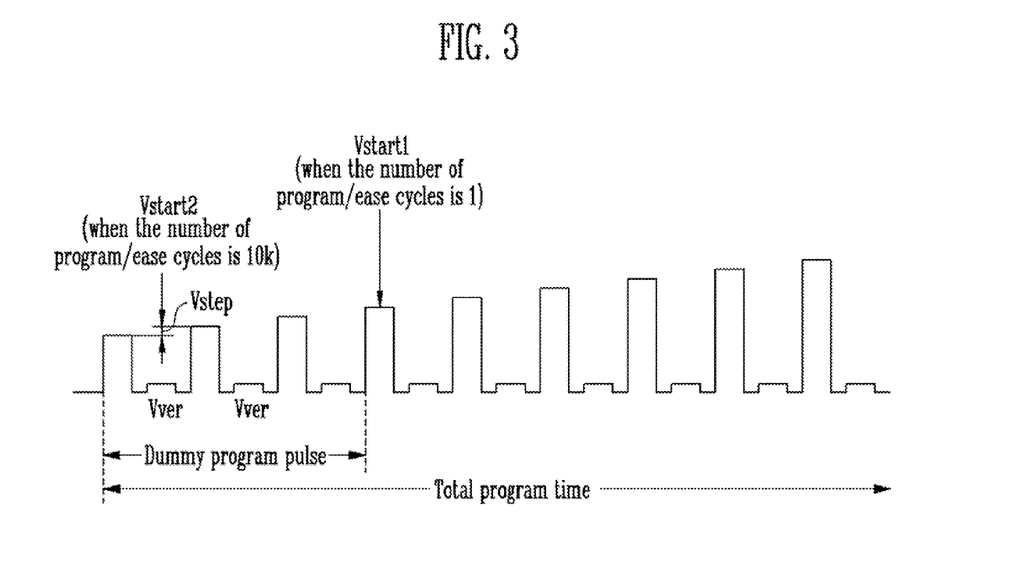
FIG. 3 is a diagram illustrating the concept of a known program method of a nonvolatile memory device.

FIG. 3 is a diagram illustrating the concept of a known program method of a nonvolatile memory device.

A program operation is performed according to the ISPP method. That is, after a program pulse is applied, a verification operation is performed. The program operation is repeatedly performed by raising a program voltage by a step voltage (Vstep) whenever the operation is repeated. Here, a period in which a dummy program pulse is applied is added with consideration taken of the program speed varying according to the number of program/erase cycles.

When the number of program/erase cycles is 1 time, an ISPP operation is performed based on a first start voltage Vstart1. On the other hand, when the number of program/erase cycles is 10K times, an ISPP operation needs to be performed based on a second start voltage Vstart2 lower than the first start voltage Vstart1 because the program speed is fast. Accordingly, the ISPP operation has to be performed based on the second start voltage Vstart2 when the program/erase operations first start. Since the program start voltage is low, a program effect may not substantially appear when the number of program/erase cycles is 1 time to 10K times. Thus, when the number of program/erase cycles is 1 time to 10K times, a program pulse may be a dummy program pulse, from a point of time at which the second start voltage Vstart2 is applied to a point of time at which the first start voltage Vstart1 is applied. Also, where the number of program erase cycles is more than 10K times, a dummy program pulse is applied. However, there is a problem in that the entire program time is increased before the number of program/erase cycles becomes 10K times.

Figure 4:
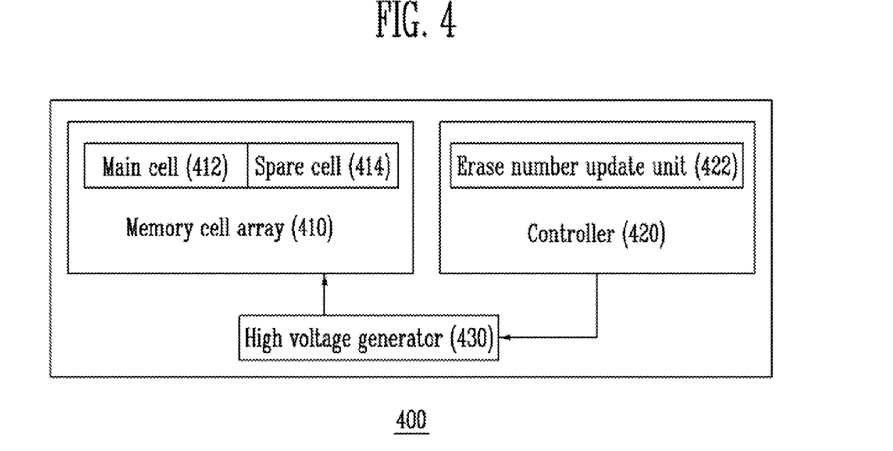
FIG. 4 is a diagram showing a nonvolatile memory device according to an embodiment.

FIG. 4 is a diagram showing a nonvolatile memory device according to an embodiment.

The nonvolatile memory device 400 includes a memory cell array 410, a controller 420, and a high voltage generator 430.

The memory cell array 410 includes a plurality of memory cells and also includes a page (i.e., the unit of a read operation or a program operation) and a memory cell block (i.e., the unit of an erase operation). The page included in the memory cell array 410 includes a main cell 412 for storing general data and a spare cell 414 for storing supplementary information. Here, the spare cell 414 stores information about the number of erase operations of a corresponding block in the form of flag data. In the present disclosure, a different program start voltage is applied according to the number of program/erase cycles. The spare cell 414 is included in each memory cell block (i.e. the unit of an erase operation) and is configured to store the number of erase operations. Preferably, the number of erase operations is classified into several sections, and flag data for distinguishing the sections is stored in the spare cell 414. For example, if the number of erase operations is classified into a total of four sections, each of the erase number sections can be distinguished using 2-bit flag data. That is, in the case where erase number information consists of a total of n bits, the number of erase operations can be classified into a total of $2^n$ sections. The $2^n$ number of different program start voltages can be set as program start voltages, and the $2^n$ number of different step voltages can be set as step voltages.

When a program operation, an erase operation, etc. for each memory cell block is performed, the controller 420 sets a program start voltage, a step voltage, or an erase voltage according to the number of erase operations of the corresponding cell block so that a program operation can be performed.

To this end, the controller 420 includes an erase number update unit 422. The erase number update unit 422 reads erase number information stored in the spare cell 414 of each memory cell block whenever an erase operation for the corresponding block is performed and updates the number of erase operations.

The high voltage generator 430 supplies the memory cell array 410 with a program start voltage, a step voltage, etc. which are set by the controller 420.

Figure 5:
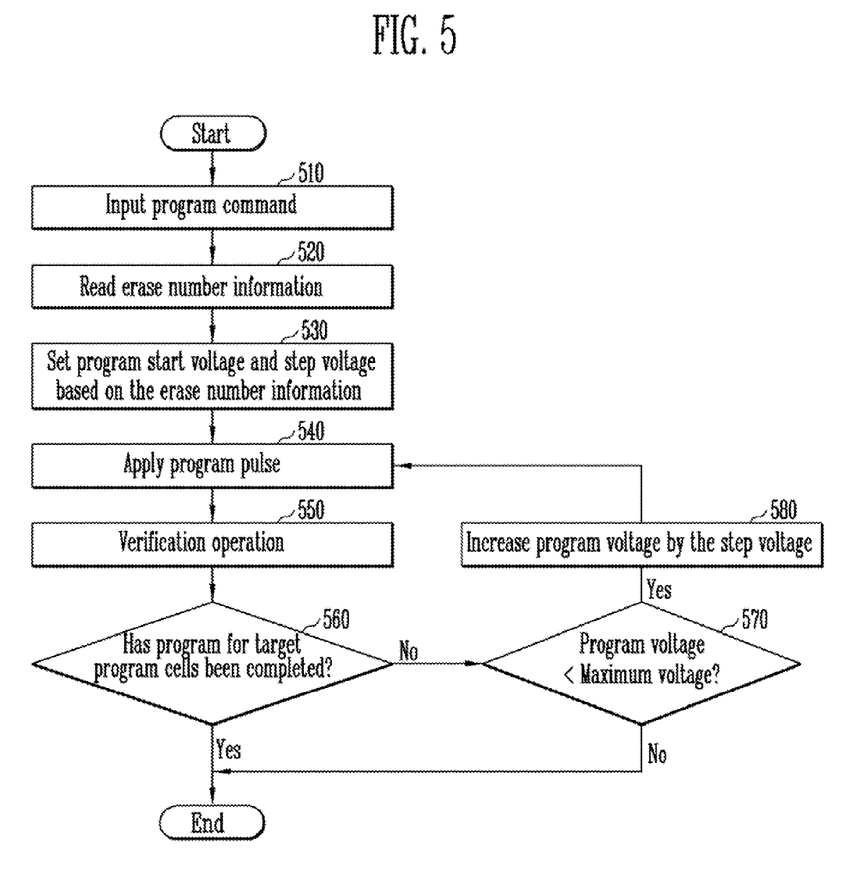
FIG. 5 is a flowchart illustrating a program method of a nonvolatile memory device according to an embodiment.

FIG. 5 is a flowchart illustrating a program method of a nonvolatile memory device according to an embodiment.

First, a program command to instruct a program operation is inputted at step 510.

Erase number information stored in the spare cell 414 is read at step 520.

The erase number information is stored in the spare cell 414 of a memory cell block including a target program page. The erase number information may indicate a section, including the number of erase operations, but not the number of erase operations itself.

Table 1 shows an example of erase number information.

TABLE 1

| Number of erase operations | 0~999 times | 1000~2999 times | 3000~9999 times | 10000 times or more |
|---|---|---|---|---|
| Number of post program pulses | 30 times or more | 10~29 times | 1~9 times | 0 |
| Erase number information | 00 | 01 | 10 | 11 |

In the case where the number of erase operations is classified into a total of four sections, at least two spare cells 414 for storing 2-bit data or a spare cell 414 for storing 2-bit data in the form of an MLC is used. Here, erase number information can be set on the basis of the number of program pulses which are applied in a post program operation. The post program operation is performed after an erase operation is performed in order to raise the threshold voltages of all cells so that a distribution of the cells is narrowed. Since each cell has to maintain an erase state, the threshold voltage of the cell does not exceed 0V although the post program operation is performed. If the number of erase operations increases, the total program speed increases. Thus, the number of program pulses applied until the post program operation is completed decreases. Accordingly, the number of erase operations executed can be determined based on the number of program pulses applied until the post program operation is completed.

Next, a program start voltage and a step voltage are set based on the erase number information at step 530.

In the present disclosure, a program operation is performed according to the ISPP method, and different program start voltages and different step voltages are applied according to the number of erase operations. That is, the program start voltage and the step voltage are decreased according to an increase in the number of erase operations.

Table 2 shows an example of setting a program start voltage and a step voltage according to erase number information.

TABLE 2

| Number of erase operations | 0~999 times | 1000~2999 times | 3000~9999 times | 10000 times or more |
|---|---|---|---|---|
| Program start voltage | 17.5 V | 17.0 V | 16.5 V | 16.0 V |
| Step voltage | 1 V | 0.9 V | 0.8 V | 0.75 V |
| Erase voltage | 18.0 V | 19.0 V | 20.0 V | 21.0 V |

As shown in Table 2, the program start voltages and the step voltages are decreased according to an increase in the number of erase operations. According to some embodiments, only the program start voltages or only the step voltages can be decreased. Furthermore, not only the erase number sections can be changed according to the characteristics of memory cells, but a different program start voltage and a different step voltage can be set on a section basis. Moreover, a different decrement of the program start voltage and a different decrement of the step voltage can be set. Preferably, whenever erase number information is changed because of a changed erase number section, the step voltage or the program start voltage is decreased by 0.1V (or about 0.1V) to 1.0V (or about 1.0V).

Next, a program pulse is applied based on the set program start voltage at step 540.

The threshold voltages of target program cells rise because of the program pulse having the set program start voltage.

A verification operation for checking whether the target program cells have been programmed to have respective threshold voltages exceeding a reference voltage is performed at steps 550 and 560.

The verification operation is performed according to the verification operation of a known nonvolatile memory device, and a detailed description thereof is omitted for simplicity.

If, as a result of the verification operation, the target program cells are programmed to have respective threshold voltages exceeding the reference voltage, the program operation is finished at step 560.

However, if, as a result of the verification operation, there are cells programmed to have respective threshold voltages not more than the reference voltage, from among the target program cells, the program voltage is increased by the step voltage at step 580, and the process returns to the step 540 to repeatedly perform the program operation.

In this case, if the program voltage reaches a set maximum voltage value, the program operation finished at step 570.

Figure 6:
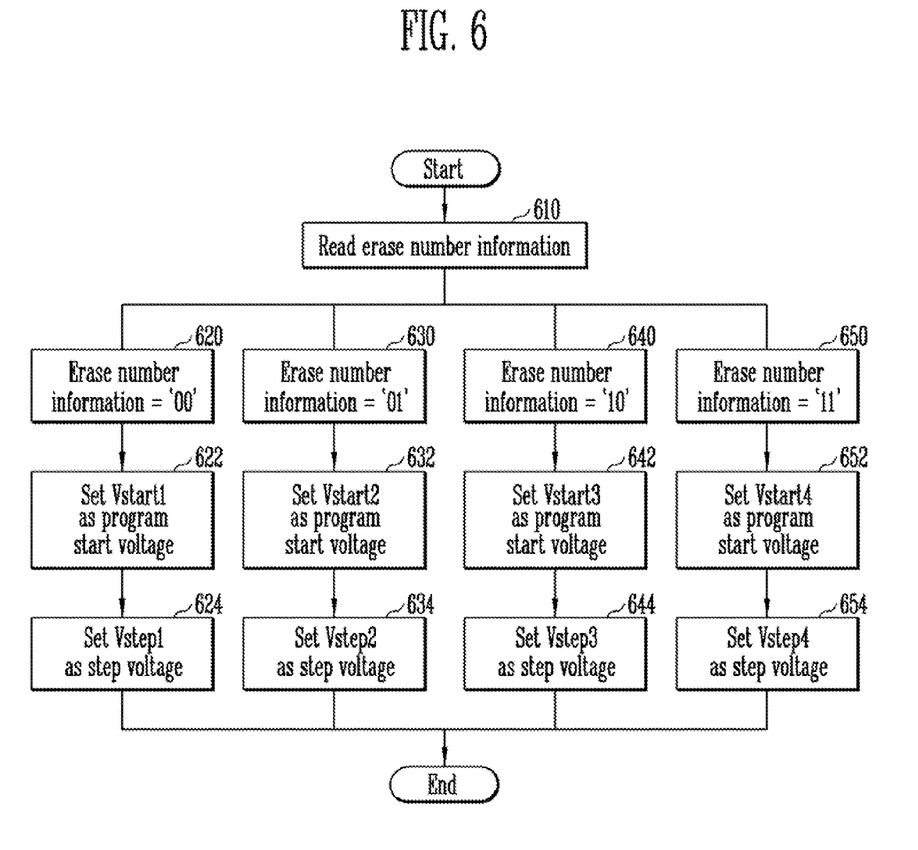
FIG. 6 is a flowchart illustrating a method of setting a program voltage based on erase number information in the program operation of the nonvolatile memory device according to an embodiment.

FIG. 6 is a flowchart illustrating a method of setting a program voltage based on erase number information in the program operation of the nonvolatile memory device according to an embodiment.

First, erase number information stored in the spare cell 414 is read at step 610.

The step 610 is substantially the same as the step 520 of FIG. 5, and a detailed description thereof is omitted for simplicity.

When the erase number information is '00' at step 620, a first program start voltage Vstart1 is set as the program start voltage at step 622, and a first step voltage Vstep1 is set as the step voltage at step 624.

When the erase number information is '01' at step 630, a second program start voltage Vstart2 is set as the program start voltage at step 632, and a second step voltage Vstep2 is set as the step voltage at step 634.

When the erase number information is '10' at step 640, a third program start voltage Vstart3 is set as the program start voltage at step 642, and a third step voltage Vstep3 is set as the step voltage at step 644.

When the erase number information is '11' at step 650, a fourth program start voltage Vstart4 is set as the program start voltage at step 652, and a fourth step voltage Vstep4 is set as the step voltage at step 654.

The above relates to an embodiment in which the number of erase operations is classified into a total of four sections as in Table 1, and a relationship between the program start voltages and the step voltages is as follows, Vstart1>Vstart2>Vstart3>Vstart4

Vstep1>Vstep2>Vstep3>Vstep4

Figure 7:
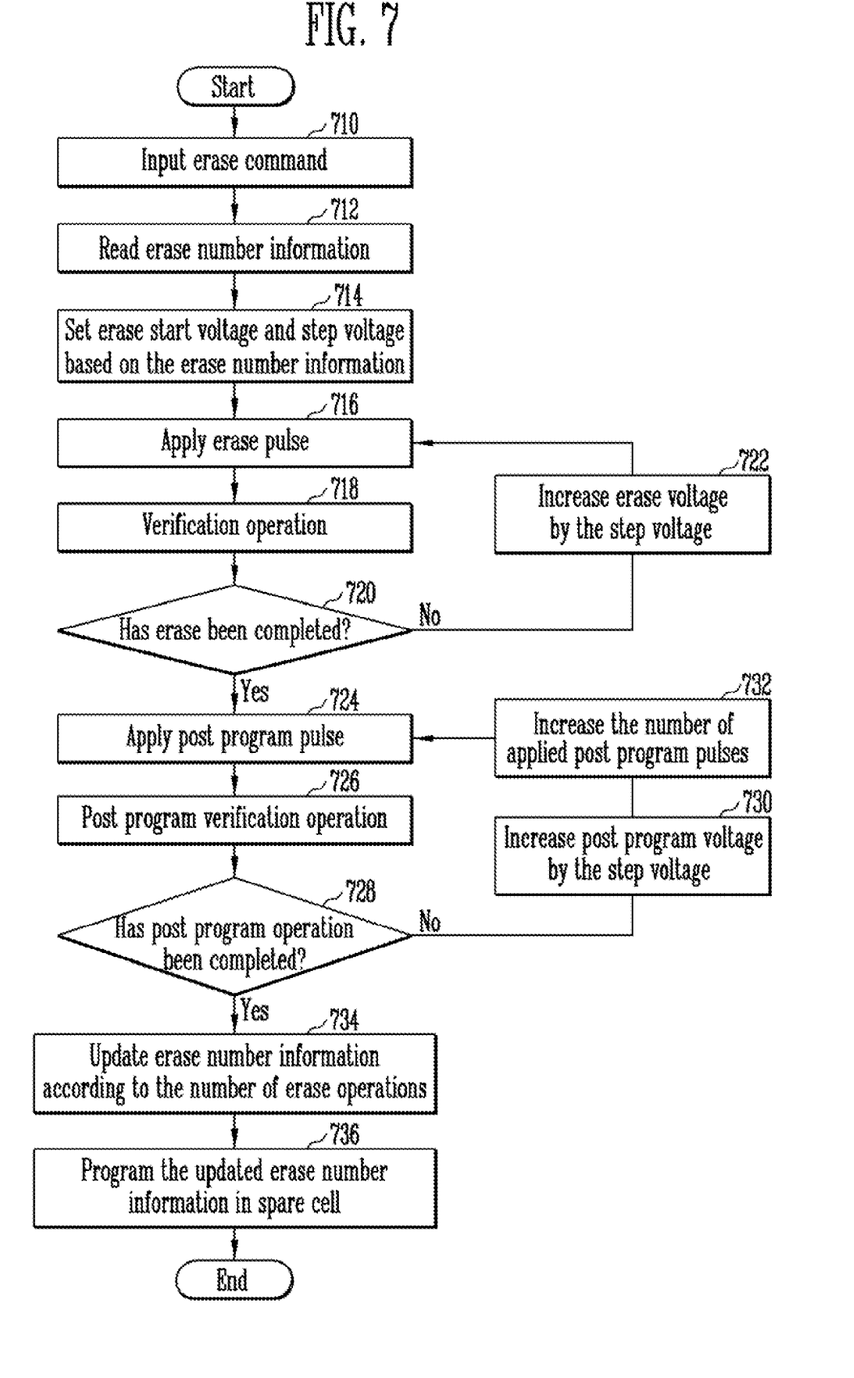
FIG. 7 is a flowchart illustrating an erase method of the nonvolatile memory device according to an embodiment.

FIG. 7 is a flowchart illustrating an erase method of the nonvolatile memory device according to an embodiment.

First, an erase command to instruct an erase operation is inputted at step 710.

Next, erase number information stored in the spare cell 414 is read at step 712.

The erase number information is stored in the spare cell 414 of a target erase memory cell block. The erase number information may indicate a section, including the number of erase operations, but not the number of erase operations itself. The erase number information is the same as that described with reference to FIG. 5, and a detailed description thereof is omitted for simplicity.

An erase voltage, an erase start voltage, or a step voltage is set based on the erase number information at step 714.

As in Table 2, the threshold voltages of programmed cells rise according to an increase in the number of erase operations. Thus it is necessary to apply a higher erase voltage.

Meanwhile, in addition to the erase method of applying an erase voltage as described above, the erase operation may be performed according to an increment step pulse erase (ISPE) method (i.e., an erase method having a similar configuration as the above ISPP method). According to the ISPE method, the erase start voltage and the step voltage are set.

Here, different erase start voltages and different step voltages are applied according to the number of erase operations. That is, the erase start voltages and the step voltages are increased according to an increase in the number of erase operations.

According to some embodiments, only the erase start voltages may be increased or only the step voltages may be increased. Furthermore, not only the erase number section can be changed according to the characteristics of memory cells, but a different erase start voltage and a different step voltage can be set on a section basis. Moreover, a different decrement of the erase start voltage and a different decrement of the step voltage may be set.

Next, an erase pulse is applied based on the set erase voltage or the set erase start voltage at step 716.

A verification operation for checking whether the threshold voltages of the target erase cells are less than 0V is performed at steps 718 and 720.

The verification operation is performed according to the erase verification operation of a known nonvolatile memory device, and a detailed description thereof is omitted for simplicity.

If, as a result of the verification operation, there are cells having respective threshold voltages not less than 0V, from among the target erase cells, the erase voltage is increased by the step voltage at step 722, and the process returns to the step 716 to repeatedly perform the erase operation.

However if, as a result of the verification operation, the threshold voltages of the target erase cells are less than 0V, the erase operation is considered as having been completed, and a post program operation is then performed at step 724.

The post program operation is similar to a known program operation. However, a difference between the known program operation and the post program operation performed in step 724 lies in that the post program operation is simultaneously performed on cells within a memory cell block on which an erase operation has been performed, whereas the known program operation is sequentially performed on cells on a page basis. Furthermore, in the post program operation, the principle of the known program operation is used, but an actual threshold voltage is lower than 0V.

As shown in FIG. 7, a post program pulse is first applied at step 724, and a verification operation is performed on the post program at steps 726 and 728. The steps 724, 726, and 728 are repeatedly performed until the post program operation is completed. At this time, the step 730 of increasing a post program voltage by the step voltage, and the step 732 of counting the number of post program pulses applied are performed.

Meanwhile, as described above, the erase number information may be set based on the number of pulses applied until the post program operation performed.

After the post program operation is completed, the erase number information is updated according to the number of erase operations at step 734.

After the erase operation and the post program operations are completed, the number of erase operations is increased by '1' and stored in the erase number update unit 422. Alternatively, the number of erase operations itself may be stored in the spare cell 414 of each memory cell block.

The erase number information may be updated may remain intact by determining to which section the increased number of erase operations belongs. For example, referring to Table 1, when the number of erase operations is increased by '1' and a total number of erase operations reaches 1000 times, the erase number information can be changed from '00' to '01' and is stored in the spare cell 414 of a corresponding memory cell block.

In the above step, in the case where the erase number information is updated, the updated erase number information is programmed into the spare cell 414 at step 736. Meanwhile, the erase number information itself may be previously included in the spare cell 414.

As described above, since the program voltage, the erase voltage, etc. are additionally set according to the erase number information, there is no need to apply a dummy program pulse with consideration taken of an increase in the program speed according to the number of program/erase cycles.

Meanwhile, according to another embodiment, which is described below with reference to FIG. 8, when reading data, a read voltage can be changed according to the number of program/erase cycles.

Figure 8:
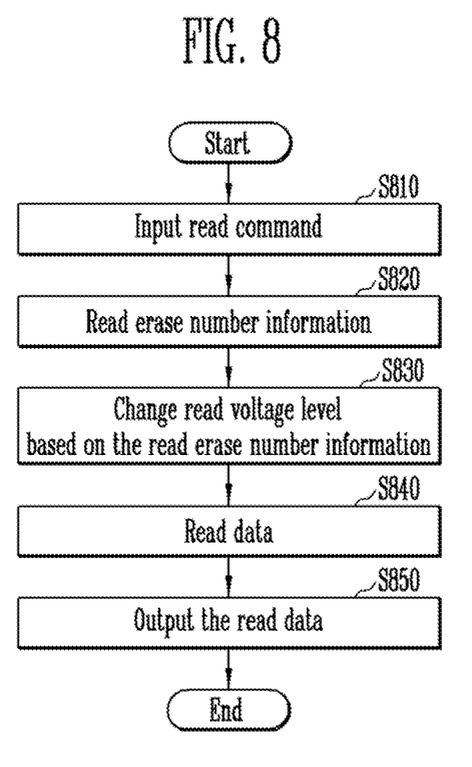
FIG. 8 is a flowchart illustrating a data read method of the nonvolatile memory device according to an embodiment.

FIG. 8 is a flowchart illustrating a data read method of the nonvolatile memory device according to an embodiment.

Referring to FIG. 8, when a data read command is inputted at step S810, erase number information stored in the spare cell 414 is read at step S820.

A data read voltage is set based on the erase number information at step S830. Since the amount of electrons trapped at memory cells increases with an increase in the number of erase operations, the threshold voltages of the cells can rise. Thus, if a higher read voltage is set according to an increase in the number of erase operations, read data can be prevented from being damaged. Data is read based on the set read voltage at step S840, and the read data is outputted externally at step S850.

Meanwhile, in FIGS. 5, 7, and 8 according to the embodiments, whenever the program or read command is inputted during the program, read, or erase operations, erase number information is read. However, according to some embodiments, when power is first supplied to the nonvolatile memory device 400, erase number information can be loaded, operating voltages including a program start voltage, a step voltage, and an erase voltage or a read voltage can be set based on the loaded erase number information, and the set operating voltages can be used until the power is turned off.

According to this disclosure, a program operation and an erase operation can be performed with consideration taken of a change in the program speed according to an increase in the number of program/erase cycles. In particular, a conventional method of applying dummy program pulses is problematic in that the time taken for a program operation to be executed is long in an initial operation in which the number of program/erase cycles is small. However, the present disclosure is advantageous in that it can reduce an overall operation time because normal program pulses can be applied even in the initial operation.

What is claimed is:

1. An erase method of a nonvolatile memory device, comprising:
   reading erase number information which is updated and stored in a spare cell whenever erasure is performed, wherein the erase number information indicates a section in which current number of erasure performed is included among a plurality of sections classified according to number of erasure;
   setting an erase start voltage and a step voltage assigned to the section indicated by the erase number information as an erase start voltage and a step voltage, respectively;
   performing an erase operation based on the erase start voltage and the step voltage;
   after the erase operation is completed, increasing a number of erase operations; and
   after increasing the number of erase operations, updating the erase number information based on the number of erase operations.

2. The erase method of claim 1, wherein the setting of the erase start voltage based on the erase number information comprises, whenever the erase number information is changed, increasing the erase start voltage by a set voltage level.

3. The erase method of claim 1, wherein the updating of the erase number information based on the number of erase operations comprises:
   maintaining the erase number information, where the number of erase operations before being increased is included in an $n^{th}$ n being an integer greater than 0, erase number section and the number of erase operations after being increased is included in the $n^{th}$ erase number section; and
   changing the erase number information, where the number of erase operations before being increased is included in an $n^{th}$ erase number section and the number of erase operations after being increased is included in an $(n+1)^{th}$ erase number section.

4. The erase method of claim 1, further comprising programming the erase number information into the spare cell after the updating of the erase number information.

5. The erase method of claim 1, further comprising:
   after the erase operation is completed, performing a post program operation;
   repeatedly applying a post program pulse until the post program operation is completed; and
   counting a number of the applied post program pulses.

6. The erase method of claim 1, wherein when the erase operation is performed, the erase start voltage is changed according to an increment step pulse erase (ISPE) method.

\* \* \* \* \*